(12) United States Patent
Yoshiharu

(10) Patent No.: US 11,955,503 B2
(45) Date of Patent: Apr. 9, 2024

(54) IMAGING ELEMENT, IMAGING SENSOR, CAMERA SYSTEM, AND DEVICE COMPRISING CAMERA SYSTEM WITH AN OVERFLOW PATH AND GATE CONNECTED STORAGE

(71) Applicant: HUAWEI TECHNOLOGIES CO., LTD., Guangdong (CN)

(72) Inventor: Kudoh Yoshiharu, Tokyo (JP)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 107 days.

(21) Appl. No.: 17/778,721

(22) PCT Filed: Nov. 21, 2019

(86) PCT No.: PCT/CN2019/120023
§ 371 (c)(1),
(2) Date: May 20, 2022

(87) PCT Pub. No.: WO2021/097770
PCT Pub. Date: May 27, 2021

(65) Prior Publication Data
US 2023/0005983 A1    Jan. 5, 2023

(51) Int. Cl.
*H01L 27/146* (2006.01)
*H04N 25/59* (2023.01)
(Continued)

(52) U.S. Cl.
CPC ....... *H01L 27/14656* (2013.01); *H04N 25/59* (2023.01); *H04N 25/65* (2023.01);
(Continued)

(58) Field of Classification Search
CPC ......... H01L 27/14656; H01L 27/14612; H01L 27/14614; H01L 27/14616; H04N 25/59; H04N 25/65; H04N 25/771
See application file for complete search history.

(56) References Cited

U.S. PATENT DOCUMENTS 10,277,848 B2 * 4/2019 Sakakibara ............ H04N 25/76
11,128,823 B2 * 9/2021 Machida ............... H04N 25/767
(Continued)

FOREIGN PATENT DOCUMENTS

CN    101939982    1/2011
CN    103354603    10/2013
(Continued)

OTHER PUBLICATIONS

Theuwissen a J P et al: "The hole role", Internationalelectron Devices Meeting 5—Jul. 12, 20055, IEEE, Piscataway, NJ.USA, Dec. 5, 2005 (Dec. 5, 2005), pp. 799-802, XP010903675, DOI: 10.1109/IEDM.2005.1609476, ISBN:978-0-7803-9268-7.
(Continued)

*Primary Examiner* — Nicholas G Giles
(74) *Attorney, Agent, or Firm* — WOMBLE BOND DICKINSON (US) LLP

(57) ABSTRACT

According to the present disclosure, an imaging element may include: a substrate or a well; a pinned photodiode disposed on the substrate; a floating diffusion region disposed on the substrate or the well; a first transfer gate transistor disposed between the pinned photodiode and the floating diffusion region a photodiode signal charge generated by the pinned photodiode to the floating diffusion region; one or more gate-controlled storages disposed on the substrate and storing a signal charge generated by the pinned photodiode as a storage signal charge; a storage-controlling gate electrode disposed adjacent to the gate-controlled storage; an overflow path disposed between the pinned photo-
(Continued)

diode and the gate-controlled storage and transferring the storage signal charge from the pinned photodiode to the gate-controlled storage; and a detecting node connected to the floating diffusion region, wherein the photodiode signal charge and the storage signal charge can be read at the detecting node.

17 Claims, 14 Drawing Sheets

(51) Int. Cl.
  *H04N 25/65* (2023.01)
  *H04N 25/771* (2023.01)
(52) U.S. Cl.
  CPC ..... *H04N 25/771* (2023.01); *H01L 27/14612* (2013.01); *H01L 27/14614* (2013.01); *H01L 27/14616* (2013.01)

(56) References Cited

U.S. PATENT DOCUMENTS

| | | |
|---|---|---|
| 2003/0197194 A1 | 10/2003 | Fried et al. |
| 2004/0051801 A1 | 3/2004 | Iizuka et al. |
| 2008/0036888 A1 | 2/2008 | Sugawa et al. |
| 2008/0108166 A1 | 5/2008 | Park et al. |
| 2009/0045319 A1 | 2/2009 | Sugawa et al. |
| 2009/0201400 A1 | 8/2009 | Zhang et al. |
| 2009/0295973 A1 | 12/2009 | Oshikubo et al. |
| 2009/0303371 A1 | 12/2009 | Watanabe et al. |
| 2011/0211103 A1 | 9/2011 | Sakano et al. |
| 2012/0002089 A1 | 1/2012 | Wang et al. |
| 2014/0077058 A1 | 3/2014 | Sakano |
| 2016/0133659 A1 | 5/2016 | Chao et al. |
| 2017/0353683 A1* | 12/2017 | Sakakibara ............ H04N 25/76 |
| 2021/0112214 A1* | 4/2021 | Machida ........... H01L 27/14656 |

FOREIGN PATENT DOCUMENTS

| | | |
|---|---|---|
| CN | 103685999 | 3/2014 |
| CN | 105679780 | 6/2016 |
| JP | 2004111590 A | 4/2004 |
| JP | 2006217410 | 8/2006 |

OTHER PUBLICATIONS

International Search Report and Written Opinion for PCT/CN2019/120023, dated Aug. 19, 2020.
Andreas Spickermann, Photodetectors in 0.35 m standard CMOS technology, May 2010, 12 pages.

* cited by examiner

IMAGING ELEMENT, IMAGING SENSOR, CAMERA SYSTEM, AND DEVICE COMPRISING CAMERA SYSTEM WITH AN OVERFLOW PATH AND GATE CONNECTED STORAGE

CROSS-REFERENCE TO RELATED APPLICATION(S)

This application is a National Stage of International Application No. PCT/CN2019/120023, filed on Nov. 21, 2019, the disclosure of which is hereby incorporated by reference in its entirety.

FIELD

The present disclosure relates to an imaging element, an imaging sensor, a camera system, and a device including a camera system.

BACKGROUND

Recently, image sensors may include a large number of imaging elements as pixels. Since a lot of imaging elements have to be arranged in an image sensor having a limited area, miniaturization of imaging elements is desired. Specifically, there is a demand for scaling down of an imaging sensor mounted on a mobile device such as a mobile phone, and therefore imaging elements arranged in such an imaging sensor have to be miniaturized. Generally, smaller imaging elements have poorer electrical and optical performance. In contrast, users demand images having higher quality.

A photodiode is generally used as an imaging element for an imaging sensor. A photodiode converts light impinging thereon into an electric charge. Intensities of light impinging on respective photodiodes can be detected and constructed as an image by reading the converted charges as electrical signals.

One important property of a photodiode is the upper limit of the capacity for storing charges converted when light impinges on the photodiode, i.e., full well capacity (FWC). If an imaging element, and therefore a photodiode, becomes smaller, the FWC decreases. FWC is a maximum signal charge which a photodiode can store. Therefore, the decrease of the FWC results in a decrease of the dynamic range. Since imaging sensors having a small dynamic range have a narrow latitude, it becomes difficult to obtain an image having a high quality without being affected by exposure conditions.

FIG. 17 shows a cross-sectional view of an imaging element 900 including a conventional photodiode having a pinned photodiode structure. If electrons are utilized as signal charges, an n type region and a p+ type region on the n type region are disposed on a p type semiconductor substrate or a p type well 902 such as silicon to form a photodiode 904. An n+ type floating diffusion region 906 is disposed adjacent to the photodiode 904. A transfer gate electrode 908 is disposed between the photodiode 904 and the floating diffusion region 906. A detecting node (not shown) for reading signals from the photodiode 904 is connected to the floating diffusion region 906 directly or via an amplifier. Although FIG. 17 shows a configuration utilizing electrons as signal charges by way of example, it should be noted that if holes are utilized as signal charges, conductivity types of respective regions are opposite to the example of FIG. 17.

When light impinges on the photodiode 904 in the imaging element 900, the photodiode 904 converts light into electrons and stores the electrons as a photodiode signal charge. After finishing the exposure, a relatively high voltage is applied on the transfer gate electrode 908, and the photodiode signal charge stored in the photodiode 904 is transferred to the floating diffusion region 906. The intensity of light impinging on the imaging element 900 can be detected by reading the photodiode signal charge on the detecting node.

Such an imaging sensor 900 reduces a dark current generated and functioning as noise when light does not impinge. However, miniaturization of the imaging sensor 900 results in a decrease of the FWC, and therefore decreases the dynamic range. In order to increase the FWC, a lateral overflow integrated capacity (LOFIC) structure, for example, is proposed (for example, Patent Publication 1).

FIG. 18 shows an imaging element 1000 having an LOFIC structure. The imaging element 1000 includes: a photodiode 1004; a floating diffusion region 1006; and a first transfer gate electrode 1008 disposed between the photodiode 1004 and the floating diffusion region 1006. A reset transistor 1023 for resetting charges remaining in the photodiode 1004 and the floating diffusion region 1006 is connected to the floating diffusion region 1006. A detecting node 1026 is connected to the floating diffusion region 1006 via an amplifier 1022 and a row-selecting transistor 1024. Therefore, these elements are configured as a pinned photodiode structure similar to the conventional imaging element 900 shown in FIG. 17. Furthermore, a storage capacitor 1014 is connected to the photodiode 1004 via an overflow gate 1016. The storage capacitor 1014 is connected to the floating diffusion region 1006 via a second transfer gate electrode 1018.

When light impinges on the photodiode 1004 of the imaging element 1000, the photodiode 1004 converts light into electrons and stores the electrons as a photodiode signal charge. If the photodiode signal charge exceeds the FWC of the photodiode 1004, charges, which are no longer stored in the photodiode 1004, are transferred via the overflow gate 1016 to and stored in the storage capacitor 1014 as a storage signal charge. After finishing the exposure, the imaging element 1000 transfers the photodiode signal charge to the floating diffusion region 1006 via the first transfer gate electrode 1008. The photodiode signal charge has a small amount of dark current noise as discussed above. The imaging element 1000 then transfers the storage signal charge to the floating diffusion region 1006 via the second transfer gate electrode 1018. Noise included in the storage signal charge and resulting from a dark current is larger than the noise of the photodiode signal charge. However, since the photodiode signal charge is read separately from the storage signal charge, the dark current noise of the storage signal charge is not important. Since an imaging element having an LOFIC structure utilizes a photodiode signal charge having a reduced dark current noise while utilizing a larger storage signal charge stored in a storage capacitor, a dynamic range of the imaging element can be improved.

However, it is known that an imaging element having an LOFIC structure has large reading noise such as thermal noise, Johnson noise, or Nyquist noise (e.g., kT/C noise, describing the total thermal noise power added to a signal when a sample is taken on a capacitor). Since a storage signal charge cannot be completely transferred from a storage capacitor to a detecting node, the storage signal charge cannot be read by using correlating double sampling (CDS). Therefore, non-negligible kT/C noise is generated. The large kT/C noise degrades a signal when switching from reading a photodiode signal charge to reading a total signal charge of the photodiode signal charge and a storage signal charge.

SUMMARY

Problem to be Solved

A problem of the present disclosure is to provide an imaging element which can completely transfer a storage signal charge to be read to a floating diffusion region in order to reduce kT/C noise resulting from a storage capacitor of an imaging element having an LOFIC structure.

Example Solutions

In one embodiment according to a first aspect of the present disclosure, an imaging element includes: a substrate or a well; a pinned photodiode disposed on the substrate or the well; a floating diffusion region disposed on the substrate or the well; a first transfer gate transistor disposed between the pinned photodiode and the floating diffusion region, the first transfer gate transistor transferring a photodiode signal charge generated by the pinned photodiode to the floating diffusion region; one or more gate-controlled storages disposed on the substrate or the well and storing a signal charge generated by the pinned photodiode as a storage signal charge; a storage-controlling gate electrode disposed adjacent to the gate-controlled storage; an overflow path disposed between the pinned photodiode and the gate-controlled storage and transferring the storage signal charge from the pinned photodiode to the gate-controlled storage; and a detecting node connected to the floating diffusion region, wherein the photodiode signal charge and the storage signal charge can be read at the detecting node, wherein the gate-controlled storage is controlled to vary a storable charge capacity by a voltage applied to the storage-controlling gate electrode.

In another embodiment according to the first aspect of the present disclosure, the gate-controlled storage is disposed on the same side of the substrate or the well as the side on which the photodiode is disposed.

In another embodiment according to the first aspect of the present disclosure, the gate-controlled storage is stacked on the photodiode.

In another embodiment according to the first aspect of the present disclosure, the imaging element further includes a second transfer gate transistor disposed between the gate-controlled storage and the floating diffusion region, wherein the storage signal charge is transferred to the floating diffusion region via the second transfer gate transistor, and is read at the detecting node.

In another embodiment according to the first aspect of the present disclosure, the storage signal charge is transferred to the floating diffusion region via the overflow path, the photodiode, and the first transfer gate transistor, and is read at the detecting node.

In another embodiment according to the first aspect of the present disclosure, the first transfer gate transistor is a planar type transistor.

In another embodiment according to the first aspect of the present disclosure, the second transfer gate transistor is a planar type transistor.

In another embodiment according to the first aspect of the present disclosure, the first transfer gate transistor is a vertical type transistor.

In another embodiment according to the first aspect of the present disclosure, the second transfer gate transistor is a vertical type transistor.

In another embodiment according to the first aspect of the present disclosure, the first transfer gate transistor is a fin type transistor.

In another embodiment according to the first aspect of the present disclosure, the second transfer gate transistor is a fin type transistor.

In another embodiment according to the first aspect of the present disclosure, the overflow path is a doping region.

In another embodiment according to the first aspect of the present disclosure, the overflow path has a transistor structure, and a conductivity of the overflow path is controlled by a voltage applied to a gate electrode.

In another embodiment according to the first aspect of the present disclosure, the gate-controlled storage has a planar type metal-oxide-silicon (MOS) structure (a semiconductor covered by an insulator on which deposits a conductive electrode).

In another embodiment according to the first aspect of the present disclosure, the gate-controlled storage has a trench type MOS structure.

In another embodiment according to the first aspect of the present disclosure, the gate-controlled storage has a fin type MOS structure.

In another embodiment according to the first aspect of the present disclosure, the storage signal charge is summed with the photodiode signal charge and is read at the detecting node.

In another embodiment according to the first aspect of the present disclosure, only the photodiode signal charge is read at the detecting node first, and then the storage signal charge is summed with the photodiode signal charge and is read at the detecting node.

In another embodiment according to the first aspect of the present disclosure, only the photodiode signal charge is read at a predetermined gain, and then the storage signal charge is summed with the photodiode signal charge and is read at a lower gain.

In one embodiment according to a second aspect of the present disclosure, a global shutter imaging element includes: a substrate or a well; a pinned photodiode disposed on the substrate or the well; a global memory disposed on the substrate or the well; a global memory controlling gate electrode disposed adjacent to the global memory; a third transfer gate transistor disposed between the pinned photodiode and the global memory, the third transfer gate transistor transferring a photodiode signal charge generated by the pinned photodiode to the global memory; a gate-controlled storage disposed on the substrate or the well; an overflow path disposed between the global memory and the gate-controlled storage, the overflow path transferring a signal charge overflown from the global memory to the gate-controlled storage as a storage signal charge; a floating diffusion region disposed on the substrate or the well; a first transfer gate transistor disposed between the global memory and the floating diffusion region, the first transfer gate transistor transferring a signal charge stored in the global memory to the floating diffusion region as a global memory signal charge; and a detecting node connected to the floating diffusion region, wherein the global memory signal charge and the storage signal charge are read at the detecting node, wherein the gate-controlled storage and the global memory are controlled to vary storable charge capacities by voltages applied to the storage-controlling gate electrode and the global memory controlling gate electrode, respectively.

In another embodiment according to the second aspect of the present disclosure, the overflow path has a transistor structure, and a conductivity of the overflow path is controlled by a voltage applied to a gate electrode of the transistor structure.

In another embodiment according to the second aspect of the present disclosure, the overflow path is a doping region.

In another embodiment according to the second aspect of the present disclosure, the storage signal charge stored in the gate-controlled storage is transferred to the detecting node via the overflow path, the global memory, the first transfer gate transistor, and the floating diffusion region.

In another embodiment according to the second aspect of the present disclosure, the gate-controlled storage includes a planar type MOS structure.

In another embodiment according to the second aspect of the present disclosure, the gate-controlled storage includes a trench type MOS structure.

In another embodiment according to the second aspect of the present disclosure, the gate-controlled storage includes a fin type MOS structure.

In another embodiment according to the second aspect of the present disclosure, the storage signal charge is summed with the global memory signal charge and is read at the detecting node.

In another embodiment according to the second aspect of the present disclosure, only the global memory signal charge is read at the detecting node first, and then the storage signal charge is summed with the global memory signal charge and is read at the detecting node.

In another embodiment according to the second aspect of the present disclosure, only the global memory signal charge is read at a predetermined gain, and then the storage signal charge is summed with the global memory signal and is read at a lower gain.

In one embodiment according to a third aspect of the present disclosure, a high dynamic range imaging sensor includes pixels having various sensitivities, each pixel including the imaging element according to any one of the above-mentioned embodiments or the global shutter imaging element according to any one of the embodiments.

In one embodiment according to a fourth aspect of the present disclosure, an imaging sensor includes white sub-pixels, each white sub-pixel including the imaging element according to any one of the above-mentioned embodiments or the global shutter imaging element according to any one of the above-mentioned embodiments.

In one embodiment according to a fifth aspect of the present disclosure, an imaging sensor includes complementary color sub-pixels, each complementary color sub-pixel including the imaging element according to any one of the above-mentioned embodiments or the global shutter imaging element according to any one of the above-mentioned embodiments.

In one embodiment according to a sixth aspect of the present disclosure, an imaging sensor includes global shutter pixels, each global shutter pixel including the global shutter imaging element according to any one of the above-mentioned embodiments.

In one embodiment according to a seventh aspect of the present disclosure, a camera system includes the imaging sensor according to any one of the above-mentioned embodiments.

In one embodiment according to an eighth aspect of the present disclosure, a device includes the camera system according to the above-mentioned embodiment.

EMBODIMENTS

Hereinafter, embodiments of the present disclosure are described with reference to the figures. Identical or similar designations herein indicate identical or similar elements.

Figure 1:
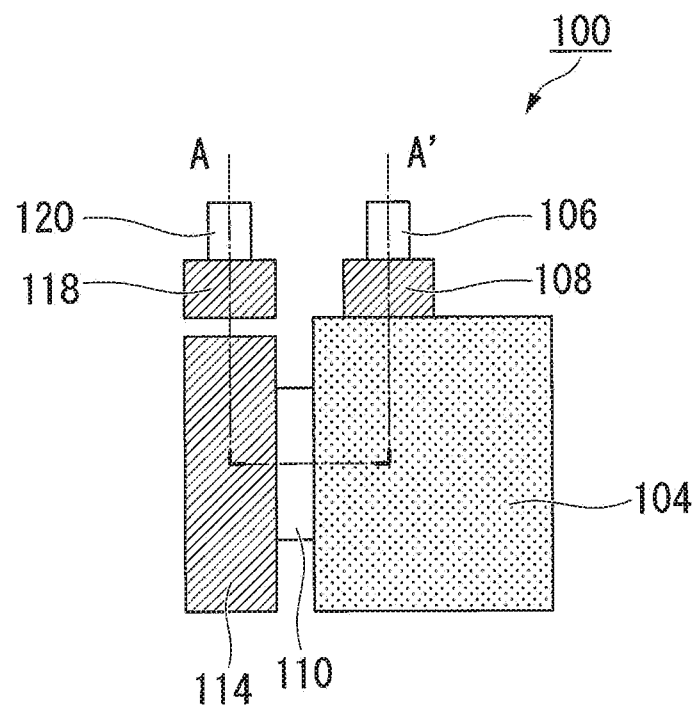
FIG. 1 is a plan view of an imaging element according to one embodiment of the present disclosure.
Figure 2:
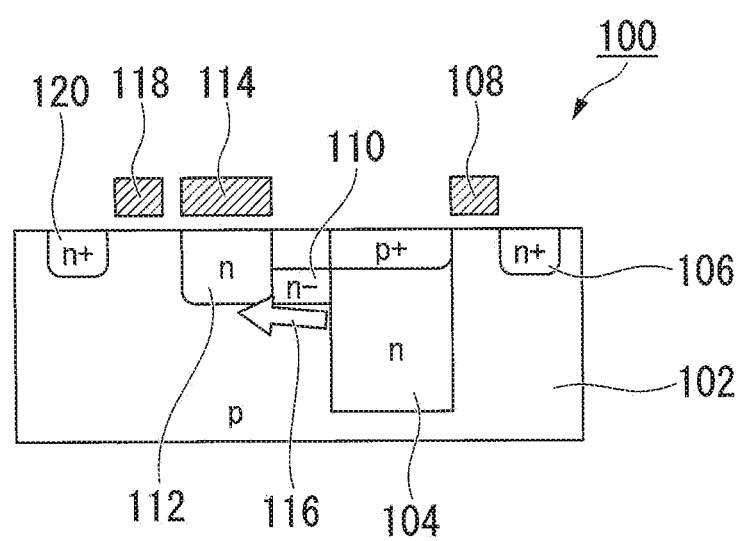
FIG. 2 shows a cross-sectional view of the imaging element shown in FIG. 1 along line AA'.
Figure 3:
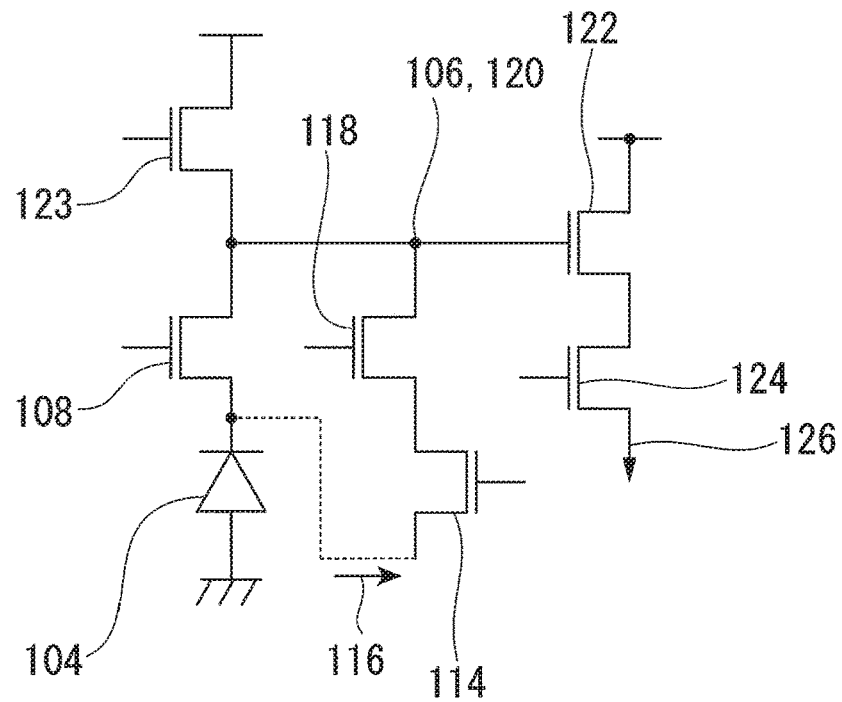
FIG. 3 shows a circuit diagram of the imaging element shown in FIGS. 1 and 2.

FIG. 1 shows a plan view of an imaging element 100 according to one embodiment of the present application. FIG. 2 shows a cross-sectional view of the imaging element 100 shown in FIG. 1 along line AA'. FIG. 3 shows a circuit diagram of the imaging element 100 shown in FIGS. 1 and 2.

The imaging element 100 includes: a substrate or a well 102 including a p type semiconductor such as silicon; a photodiode 104 including an n type region disposed on the substrate or the well 102 and a p+ type region adjacent to the n type region in a direction perpendicular to a surface of the substrate or the well 102 and disposed on the surface of the substrate or the well 102; a floating diffusion region 106 including an n+ type region separated from the photodiode 104 by a predetermined distance; and a first transfer gate electrode 108 disposed between the photodiode 104 and the floating diffusion region 106 and on the surface of the substrate or the well 102. The photodiode 104 has a pinned photodiode structure.

The imaging element 100 also includes: an overflow path 110 including an n− type region connected to the n type region of the photodiode 104; a gate-controlled storage 112 separated from the photodiode 104 by a predetermined distance and including an n− type region connected to the overflow path 110; a storage-controlling gate electrode 114 adjacent to the gate-controlled storage 112 in a direction perpendicular to the surface of the substrate or the well 102 and disposed on the surface of the substrate or the well 102; a floating diffusion region 120 separated from the gate-controlled storage 112 by a predetermined distance and including an n+ type region; and a second transfer gate electrode 118 disposed between the gate-controlled storage 112 and the floating diffusion region 120 and on the surface of the substrate or the well 102. Therefore, the gate-controlled storage 112 and the storage-controlling gate electrode 114 have a planer MOS structure. Although FIG. 3 shows the imaging element 100 including one gate-controlled storage 112, the imaging element 100 may include a plurality of gate-controlled storages 112 connected, for example, in parallel, in series, or in an array. The floating diffusion region 120 may be connected to or integrated with the floating diffusion region 106. FIG. 3 shows a configuration including the floating diffusion region 120 integrated with the floating diffusion region 106.

The n type regions, n+ type regions, n− type regions, p type regions, and p+ type regions can be fabricated as doping regions by using variety of doping techniques such as diffusion and ion implantation.

Although not shown in FIGS. 1 and 2, a reset transistor 123, which can supply a voltage-drain-drain (VDD) voltage, may be connected to the floating diffusion regions 106, 120. The floating diffusion regions 106, 120 may be connected to a detecting node 126 directly or via an amplifier 122 and a row-selecting transistor 124 as shown in FIG. 3.

A first transfer gate transistor formed by the first transfer gate electrode 108, a second transfer gate transistor formed by the second transfer gate electrode 118, the amplifier 122, the reset transistor 123, and the row-selecting transistor 124, which may be included in the imaging element 100, may be conventional planar type transistors. In other embodiments, variety of transistors such as a vertical type transistor including a stack type and a trench type, and a fin type transistor can be employed.

Figure 4:
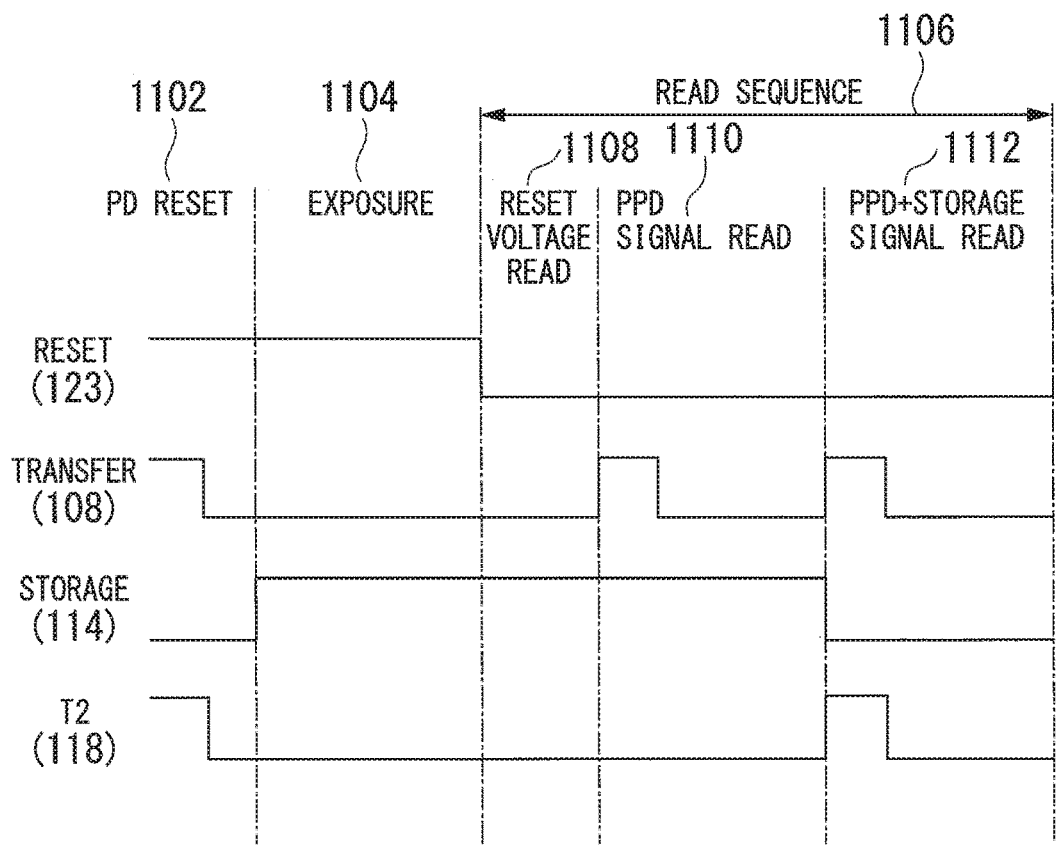
FIG. 4 shows a timing chart representing an operation of the imaging element shown in FIGS. 1 to 3.
Figure 5A:
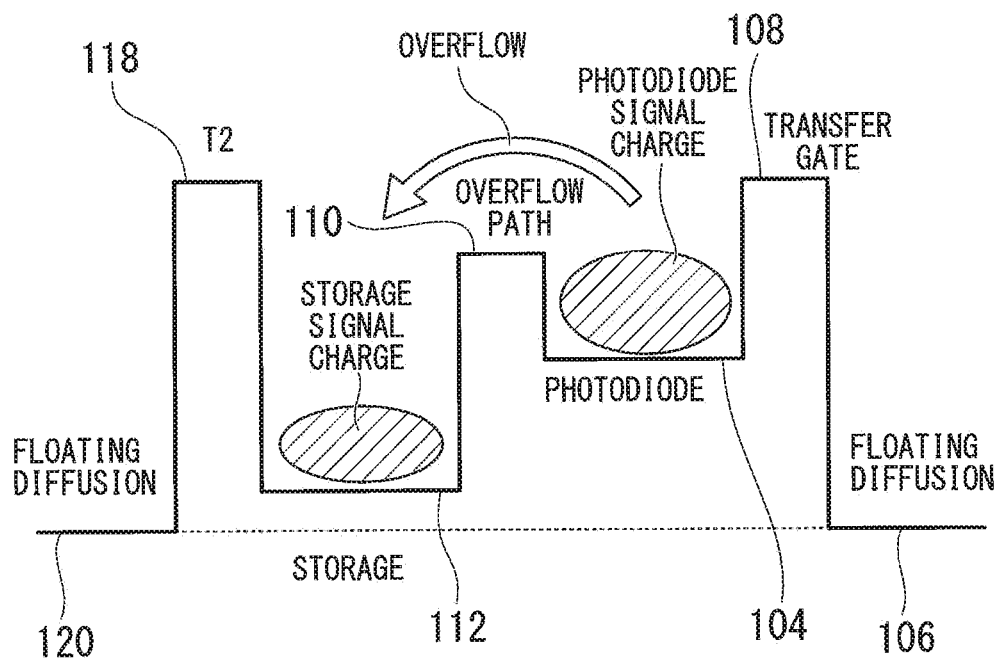
FIG. 5a shows a schematic diagram of a potential of the imaging element shown in FIGS. 1 to 3 during exposure shown in FIG. 4.
Figure 5B:
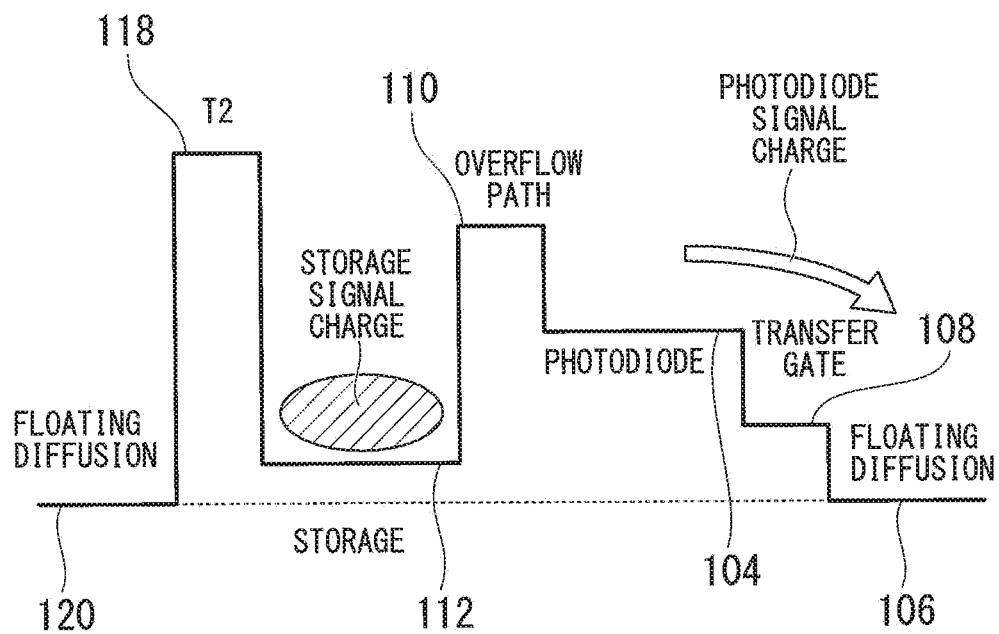
FIG. 5b shows a schematic diagram of a potential of the imaging element shown in FIGS. 1 to 3 during reading a photodiode signal charge shown in FIG. 4.
Figure 5C:
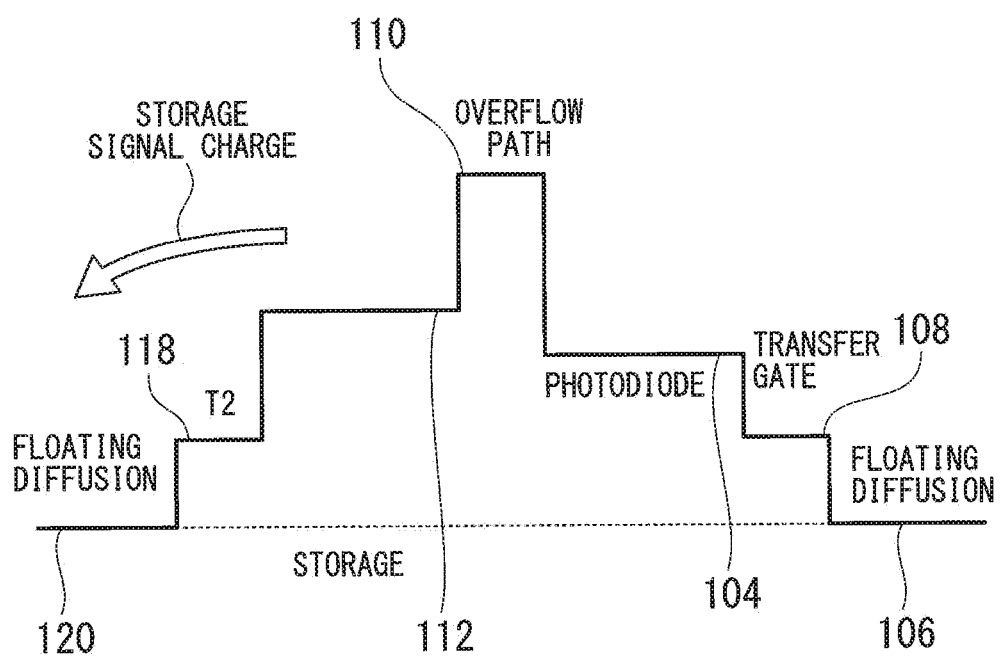
FIG. 5c shows a schematic diagram of a potential of the imaging element shown in FIGS. 1 to 3 during reading the photodiode signal charge and a storage signal charge shown in FIG. 4.

An operation of the imaging element 100 is discussed with reference to FIGS. 4 and 5a to 5c. FIG. 4 shows a timing chart 1100 representing the operation of the imaging element 100, and FIGS. 5a to 5c show diagrams representing potentials of the photodiode 104, the first transfer gate transistor having the first transfer gate electrode 108, the gate-controlled storage 114, and the second transfer gate transistor having the second transfer gate electrode 118.

In FIG. 4, operation 1102 of resetting the photodiode 104 is carried out. The reset transistor 123 is turned on, and relatively high voltages are applied to the first and second transfer gate electrodes 108, 118 (for example, the first and second transfer gate electrodes 108, 118 are pulled up). A relatively low voltage is applied to the storage-controlling gate electrode 114 (for example, the storage-controlling gate electrode 114 is pulled down). In this case, the VDD voltage is applied to the floating diffusion regions 106, 120, and the floating diffusion regions 106, 120 are reset. Since the potentials of the photodiode 104 and the gate-controlled storage 112 are shallower than those of the floating diffusion regions 106, 120, residual signal charges are transferred to the floating diffusion regions 106, 120. Therefore, the photodiode 104 and the gate-controlled storage 112 are completely depleted.

An exposure operation 1104 is then carried out. The first and second transfer gate electrodes 108, 112 are pulled down, and the storage-controlling gate electrode 114 is pulled up. Since the reset transistor 123 remains on, the floating diffusion regions 106, 120 are fixed to the VDD state. Therefore, the voltages of the floating diffusion regions 106, 120 are not shifted due to a leak current, etc. FIG. 5a shows a potential diagram during the exposure operation 1104. Since the first and second transfer gate electrodes 108, 114 are pulled down, the first and second transfer gate transistors have high potentials. Since the photodiode 104 has a relatively low well-type potential due to its n type region. Since the storage-controlling gate electrode 114 is pulled up, the gate-controlled storage 112, which is the n type region, has a well-type potential lower than that of the photodiode 104. The overflow path 110 has a potential lower than those of the first and second transfer gate transistors and higher than those of the photodiode 104 and the gate-controlled storage 112 due to the n− type region of the overflow path 110. The floating diffusion region has the lowest potential due to its n+ type region. In the exposure operation 1104 in which the imaging element 100 has such a potential, when light impinges on the photodiode 104, the photodiode 104 converts light into electrons. Until the potential of the photodiode 104 saturates, the electrons are stored in the well-type potential of the photodiode 104 as a photodiode signal charge without flowing out to the gate-controlled storage 112 via the overflow path 110. After the electrons are stored to saturate the potential of the photodiode 104, the electrons flow out to the gate-controlled storage 112 via the overflow path 110 as indicated by arrow 116 in FIG. 3 and are stored in the well-type potential of the gate-controlled storage 112 as the storage signal charge (similarly, arrows 216 of FIG. 6, 316 of FIG. 7, 416 of FIG. 8, 516 of FIG. 9, 616 of FIG. 11, 716 of FIG. 14, and 816 of FIG. 16 indicate respective electron flow directions upon saturation).

A reading sequence 1106 is then carried out. The reading sequence 1106 includes: operation 1108 of resetting reading voltages; operation 1110 of reading a photodiode signal charge; and operation 1112 of reading a total signal charge.

In operation 1108 of resetting reading voltages, the reset transistor 123 is turned off, and the floating diffusion regions 106, 120 are in a floating state. The voltage of the floating diffusion regions 106, 120 in a floating state is read out as a reset signal for a correlation double sampling (CDS) which will be discussed below. If the reset transistor 123 is turned off in the exposure operation 1104 as discussed above, operation 1108 of resetting reading voltages may be omitted or skipped.

Then the first transfer gate electrode 108 is pulled up in operation 1110 of reading the photodiode signal charge. FIG. 5b shows a potential diagram in operation 1110 of reading the photodiode signal charge. Since the first transfer gate electrode 108 is pulled up, the potential of the first transfer gate transistor is lowered. When the potential becomes lower than that of the photodiode 104, the photodiode signal charge stored in the photodiode 104 is transferred to the floating diffusion region 106. After the transfer is finished, the first transfer gate electrode 108 is pulled down. The photodiode signal charge having a small amount of dark current noise is read at the detecting node 126 directly or via the amplifier 122 in case that the imaging element 100 includes the circuit configuration shown in FIG. 3, and operation 1110 of reading the photodiode signal charge finishes.

The second transfer gate electrode 118 is pulled up in operation 1112 of reading a total signal charge. If the storage-controlling gate electrode 114 remains pulled up, the potential of the gate-controlled storage 112 is deep and the storage signal charge cannot be completely transferred to the floating diffusion region 120. Therefore, the storage-controlling gate electrode 114 is pulled down and the potential of the gate-controlled storage 112 is lowered. The first transfer gate electrode 108 is also pulled up, and charges remaining in the photodiode 104 in operation 1110 and charges which have flown back from the gate-controlled storage 112, are transferred to the floating diffusion region 106. These operations allow the signal charges in the photodiode 104 and the gate-controlled storage 112 to be read out. FIG. 5c shows a potential diagram in operation 1112 of the total signal charge. The transferred photodiode signal charge and the storage signal charge change the voltages of the floating diffusion regions 106, 120. These voltages are read out directly or, in case shown in FIG. 3, by amplified through the amplifier 122. Comparing the voltage of the read signal charges with the reset signal discussed above, the correlation double sampling (CDS) can be carried out.

The imaging element 100 can store the electrons in the gate-controlled storage 112 via the overflow path 110 even if the photodiode 104 has saturated. Therefore, the imaging element 100 can have an FWC larger than that of conventional imaging elements. Furthermore, the signal charge can be read by using correlation double sampling (CDS) and therefore the effect of the kT/C noise can be reduced. When light impinging on the photodiode 104 is small, the photodiode signal charge having a small dark current can be used. When light impinging on the photodiode 104 is large, the photodiode signal charge and the storage signal charge can be used. Therefore, an image having a high quality and a large dynamic range can be obtained. This effect becomes more significant by reading the photodiode signal charge at a higher gain first, and then by reading the photodiode signal charge and the storage signal charge at a lower gain.

Although an example utilizing electrons as a signal charge was described in this embodiment, it should be noted that respective regions of an imaging element have inverted conductivity types if holes are utilized as a signal charge. Furthermore, it should be noted that the potentials shown in FIGS. 5a to 5c have inverted signs, i.e., the inverted levels of the potentials. Although discussions below will be made with an example of imaging elements utilizing electrons as a signal charge, it should be noted that respective regions have inverted conductivity types and therefore inverted levels of potentials if holes are utilized as a signal charge.

Figure 6:
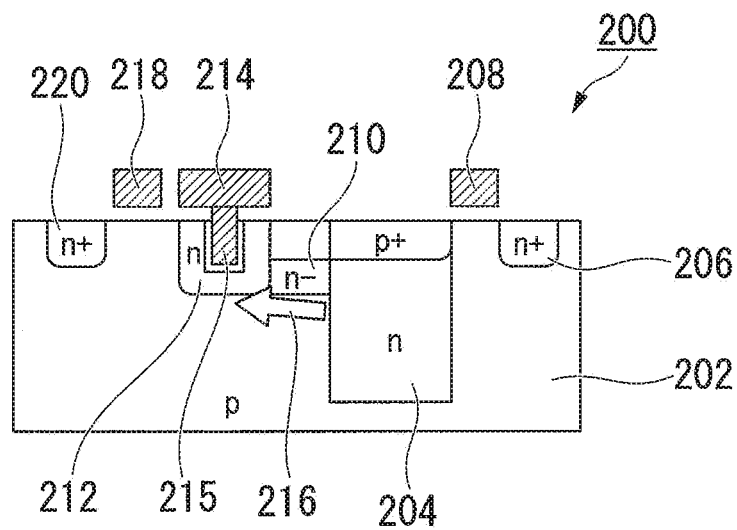
FIG. 6 shows a cross-sectional view of an imaging element according to another embodiment of the present disclosure.

FIG. 6 shows a cross-sectional view of an imaging element 200 according to another embodiment of the present disclosure. The imaging element 200 includes: a substrate or a well 202 including a p type semiconductor such as silicon; a photodiode 204 including an n type region disposed on the substrate or the well 202 and a p+ type region adjacent to the n type region in a direction perpendicular to the surface of the substrate or the well 202 and disposed on the surface of the substrate or the well 202; a floating diffusion region 206 including an n+ type region separated from the photodiode 204 by a predetermined distance; and a first transfer gate electrode 208 disposed between the photodiode 204 and the floating diffusion region 206 and on the surface of the substrate or the well 202. The photodiode 204 has a pinned photodiode structure.

The imaging element 200 also includes: an overflow path 210 including an n− type region connected to the n type region of the photodiode 204; a gate-controlled storage 212 including an n type region separated from the photodiode 204 by a predetermined distance and connected to the overflow path 210; a storage-controlling gate electrode 214 adjacent to the gate-controlled storage 212 in a direction perpendicular to the surface of the substrate or the well 202 and disposed on the surface of the substrate or the well 202; a floating diffusion region 220 including an n+ region separated from the gate-controlled storage 212 by a predetermined distance; and a second transfer gate electrode 218 disposed between the gate-controlled storage 212 and the floating diffusion region 220 and on the surface of the substrate or the well 202. Although FIG. 6 shows the imaging element 200 including one gate-controlled storage 212, the imaging element 200 may include a plurality of gate-controlled storages 212 connected, for example, in parallel, in series, or in an array. The floating diffusion region 220 may be connected to or integrated with the floating diffusion region 206.

Different from the imaging element 100 discussed above, the gate-controlled storage 212 of the imaging element 200 has a trench shape. A portion of the storage-controlling gate electrode 214 protrudes into the trench and is formed as a buried electrode 215. Therefore, the gate-controlled storage 212, the storage-controlling gate electrode 214, and the buried electrode 215 have a trench-type MOS structure. The imaging element 200 has a configuration similar to the imaging element 100 discussed above except for the trench type MOS structure of the gate-controlled storage 212. Therefore, since the imaging element 200 operates based on a mechanism similar to that of the imaging element 100, the detailed operation of the imaging element 200 is not discussed.

The gate-controlled storage 212 of the imaging element 200 can store a storage signal charge larger than that of the imaging element 100 with the same footprint. Therefore, the imaging element 200 has an increased FWC and an increased dynamic range. If the imaging element 200 has the same FWC as that of the imaging element 100, the size of the gate-controlled storage 212 can be reduced which results in a miniaturized device and an increased aperture ratio.

Figure 7:
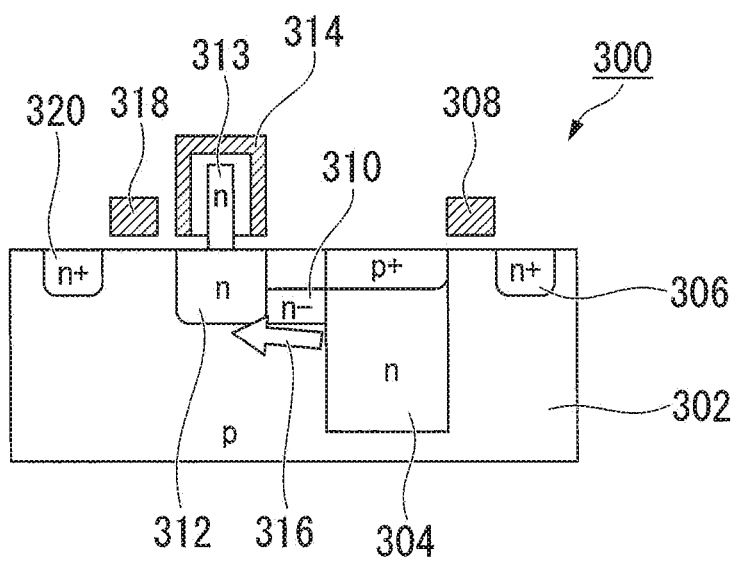
FIG. 7 shows a cross-sectional view of an imaging element according to another embodiment of the present disclosure.

FIG. 7 shows a cross-sectional view of an imaging element 300 according to another embodiment of the present disclosure. The imaging element 300 includes: a substrate or a well 302 including a p type semiconductor such as silicon; a photodiode 304 including an n type region disposed on the substrate or the well 302 and a p+ type region adjacent to the n type region in a direction perpendicular to the surface of the substrate or the well 302 and disposed on the surface of the or the well substrate 302; a floating diffusion region 306 including an n+ type region separated from the photodiode 304 by a predetermined distance; and a first transfer gate electrode 308 disposed between the photodiode 304 and the floating diffusion region 306 and on the surface of the substrate or the well 302. The photodiode 304 has a pinned photodiode structure.

The imaging element 300 also includes: an overflow path 310 including an n− type region connected to the n type region of the photodiode 304; a gate-controlled storage 312 including an n type region separated from the photodiode 304 at a predetermined distance and connected to the overflow path 310; a storage-controlling gate electrode 314 adjacent to the gate-controlled storage 312 in a direction perpendicular to the surface of the substrate or the well 302 and disposed on the surface of the substrate or the well 302; a floating diffusion region 320 including an n+ region separated from the gate-controlled storage 312 at a predetermined distance; and a second transfer gate electrode 318 disposed between the gate-controlled storage 312 and the floating diffusion region 320 and on the surface of the substrate or the well 302. Although FIG. 7 shows the imaging element 300 including one gate-controlled storage 312, the imaging element 300 may include a plurality of gate-controlled storages 312 connected, for example, in parallel, in series, or in an array. The floating diffusion region 320 may be connected to or integrated with the floating diffusion region 306.

Different from the imaging element 100 discussed above, the gate-controlled storage 312 of the imaging element 300 has a protrusion 313 having a fin-shape and the storage-controlling gate electrode 314 covers the protrusion 313. Therefore, the gate-controlled storage 312, the protrusion 313, and the storage-controlling gate electrode 314 have a fin type MOS structure. The imaging element 300 has a configuration similar to the imaging element 100 discussed above except for the fin type MOS structure of the gate-controlled storage 312. Therefore, since the imaging element 300 operates based on a mechanism similar to that of the imaging element 100, the detailed operation of the imaging element 300 is not discussed.

The gate-controlled storage 312 of the imaging element 300 can store a storage signal charge larger than that of the imaging element 100 with the same footprint. Therefore, the imaging element 300 can have an increased FWC and an increased dynamic range. If the imaging element 300 has the same FWC as that of the imaging element 100, the size of the gate-controlled storage 312 can be reduced which results in a miniaturized device and an increased aperture ratio.

Figure 8:
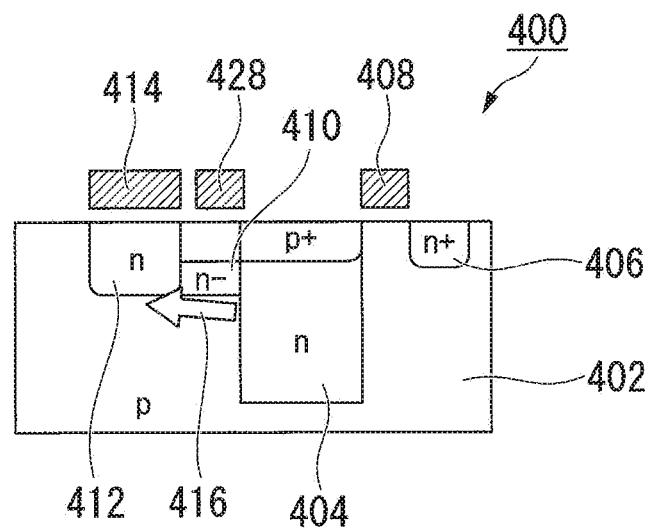
FIG. 8 shows a cross-sectional view of an imaging element according to another embodiment of the present disclosure.

FIG. 8 shows a cross-sectional view of an imaging element 400 according to another embodiment of the present disclosure. The imaging element 400 includes: a substrate or a well 402 including a p type substrate such as silicon; a photodiode 404 including an n type region disposed on the substrate or the well 402 and a p+ type region adjacent to the n type region in a direction perpendicular to the surface of the substrate or the well 402 and disposed on the surface of the substrate or the well 402; a floating diffusion region 406 including an n+ type region separated from the photodiode 404 by a predetermined distance; and a first transfer gate electrode 408 disposed between the photodiode 404 and the floating diffusion region 406 and on the surface of the substrate or the well 402. The photodiode 404 has a pinned photodiode structure.

The imaging element 400 also includes: an overflow path 410 including an n− type region connected to the n type region of the photodiode 404; a gate-controlled storage 412 including an n type region separated from the photodiode 404 by a predetermined distance and connected to the overflow path 410; and a storage-controlling gate electrode 414 adjacent to the gate-controlled storage 412 in a direction perpendicular to the surface of the substrate or the well 402 and disposed on the surface of the substrate or the well 402. The imaging element 400 further includes an overflow-controlling gate electrode 428 adjacent to the overflow path 410 in a direction perpendicular to the surface of the substrate or the well 402 and disposed on the surface of the substrate or the well 402. Therefore, the overflow path 410 and the overflow-controlling gate electrode 428 have a transistor structure and the conductivity or the potential can be controlled by a voltage applied to the overflow-controlling gate electrode 428. Comparing with the imaging element 100, the imaging element 400 does not include a floating diffusion region adjacent to the gate-controlled storage 412, and a second transfer gate electrode. Although FIG. 8 shows the imaging element 400 including one gate-controlled storage 412, the imaging element 400 may include a plurality of gate-controlled storages 412 connected, for example, in parallel, in series, or in an array.

In the exposure operation of the imaging element 400, the first transfer gate electrode 408 and the overflow-controlling gate electrode 428 are turned off, and the storage-controlling gate electrode 414 is turned on. Therefore, electrons converted from light by the photodiode 404 are at first stored in the photodiode 404 as a photodiode signal charge. After the photodiode 404 saturates, the electrons are transferred to the gate-controlled storage 412 via the overflow path 410 along arrow 416 and are stored in the gate-controlled storage 412. In the operation of reading the photodiode signal charge, the first transfer gate electrode 408 is turned on, and the photodiode signal charge is transferred to the floating diffusion region 406 and is read. In the operation of reading the storage signal charge, the first transfer gate electrode 408 and the overflow-controlling gate electrode 428 are then turned on and the storage-controlling gate electrode 414 is turned off. Therefore, the potentials of the respective elements are lowered in the order: the gate-controlled storage 412; the overflow path 410; the photodiode 404; the first transfer gate transistor; and the floating diffusion region 406. The storage signal charge in the gate-controlled storage 412 is transferred to the floating diffusion region 406 via the overflow path 410, the photodiode 404, and the first transfer gate transistor, and is read.

Comparing with the imaging element 100, the imaging element 400 does not include a second transfer gate electrode, and a floating diffusion region connected to the second transfer gate electrode. Therefore, the number of gate electrodes and the size of the imaging sensor 400 can be reduced. If the foot print of the imaging element 400 is the same as that of the imaging element 100, the sizes of the gate-controlled storage 412 and/or the photodiode 404 can be increased, and therefore the FWC, e.g., the dynamic range, and the aperture ratio, e.g., the sensitivity, can be increased.

Figure 9:
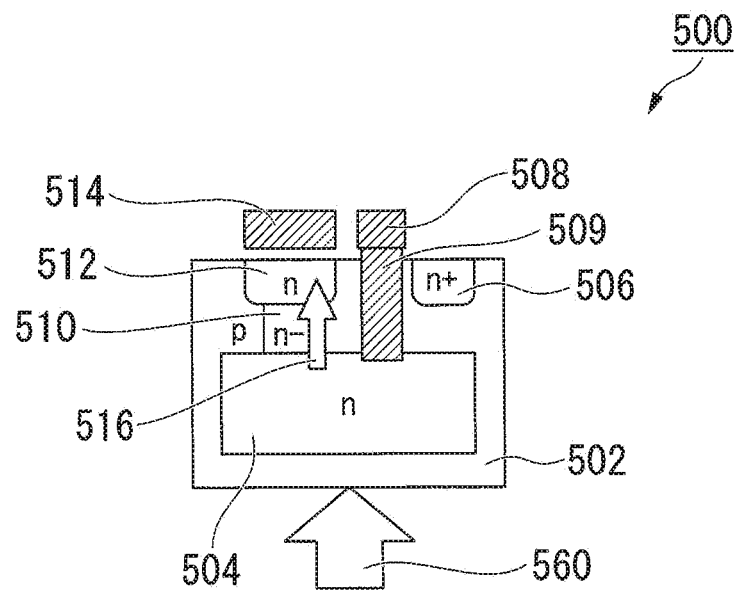
FIG. 9 shows a cross-sectional view of an imaging element according to another embodiment of the present disclosure.

FIG. 9 shows a cross-sectional view of an imaging element 500 according to another embodiment of the present disclosure. The imaging element 500 includes: a substrate or a well 502 including a p type semiconductor such as silicon; a photodiode 504 including an n type region disposed in an area near one side of the substrate or the well 502; a floating diffusion region 506 including an n+ region disposed on a surface of the substrate or the well 502 opposite to the surface on the side where the photodiode 504 is disposed; a first transfer gate electrode 508 disposed adjacent to the floating diffusion region 506 and on the same surface as the surface where the floating diffusion region 506 is disposed; a protrusion 509 of the first transfer gate electrode 508 extending in the substrate or the well 502 from the first transfer gate electrode 508 to the photodiode 504; a gate-controlled storage 512 including an n type region disposed on the same surface as the floating diffusion region 506; an overflow path 510 including an n− type region disposed between the photodiode 504 and the gate-controlled storage 512 in order to connect the photodiode 504 with the gate-controlled storage 512; and a storage-controlling gate electrode 514 adjacent to the gate-controlled storage 512 in a direction perpendicular to the surface of the substrate or the well 502 and disposed on the surface of the substrate or the well 502. Although FIG. 9 shows the imaging element 500 including one gate-controlled storage 512, the imaging element 500 may include a plurality of gate-controlled storages 512 connected, for example, in parallel, in series, or in an array.

In the exposure operation of the imaging element 500, the first transfer gate electrode 508 is turned off, and the storage-controlling gate electrode 514 is turned on. When light 560 impinges on the surface of the side where the photodiode 504 is disposed, the photodiode 504 converts light into electrons. Until the photodiode 504 saturates, the electrons are stored in the photodiode 504 as a photodiode signal charge. After the photodiode 504 saturates, the electrons are transferred to the gate-controlled storage 512 via the overflow path 510 and are stored in the gate-controlled storage 512 as a storage signal charge. In the operation of reading the photodiode signal charge, the first transfer gate electrode 508 is turned on, and the photodiode signal charge is transferred to the floating diffusion region 506. In the operation of reading the storage signal charge, the first transfer gate electrode 508 is turned on, and the storage-controlling gate electrode 514 is turned off. The storage signal charge is then transferred from the gate-controlled storage 512 to the floating diffusion region 506 via the overflow path 510, the photodiode 504, and the first transfer gate transistor and is read, similarly to the imaging element 400.

The imaging element 500 has a vertical structure in which the first transfer gate electrode 508, the floating diffusion region 506, the overflow path 510, the gate-controlled storage 512, and the storage-controlling gate electrode 514 can overlap the photodiode 504. Therefore, miniaturization of the imaging element 500, improvement of the aperture ratio by enlarging the photodiode 504, improvement of the sensitivity, improvement of the FWC by enlarging the gate-controlled storage 512, and improvement of the dynamic range can be achieved.

Figure 10:
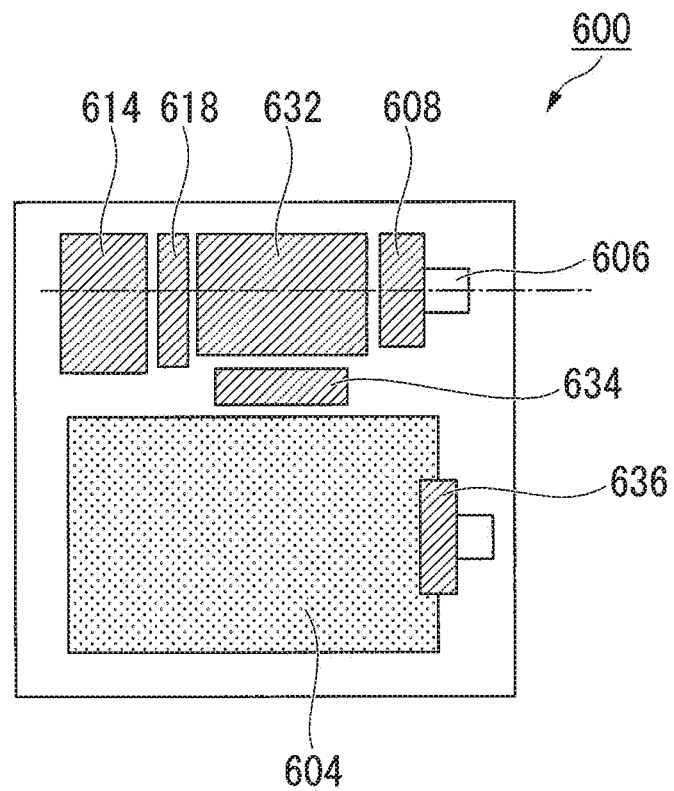
FIG. 10 shows a plan view of a global shutter imaging element according to one embodiment of the present disclosure.
Figure 11:
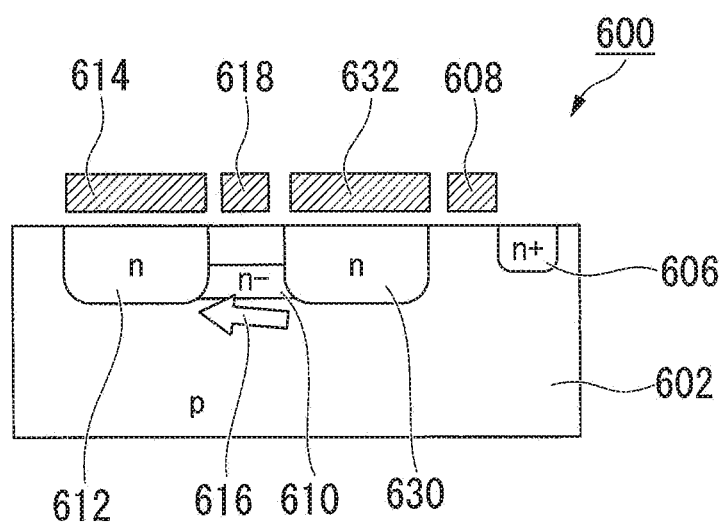
FIG. 11 shows a cross sectional view of the global shutter imaging element shown in FIG. 10 along the dotted line.

FIG. 10 shows a plan view of an imaging element 600 according to another embodiment of the present disclosure, and FIG. 11 shows a cross-sectional view of the imaging element 600 shown in FIG. 10 along the dotted line. The imaging element 600 includes: a substrate or a well 602 including a p type semiconductor such as silicon; a photodiode 604 including an n type region disposed on the substrate or the well 602 and a p+ type region adjacent to the n type region in a direction perpendicular to the surface of the substrate or the well 602 and disposed on the surface of the substrate or the well 602; a floating diffusion region 606 including an n+ type region; and a first transfer gate electrode 608 disposed adjacent to the floating diffusion region 606. The photodiode 604 has a pinned photodiode structure.

The imaging element 600 also includes: an overflow path 610 including an n− type region; a gate-controlled storage 612 including an n type region connected to the overflow path 610; a storage-controlling gate electrode 614 adjacent to the gate-controlled storage 612 in a direction perpendicular to the surface of the substrate or the well 602 and disposed on the surface of the substrate 602 or the well; and a second transfer gate electrode 618 adjacent to the overflow path 610 in a direction perpendicular to the surface of the substrate or the well 602 and disposed on the surface of the substrate or the well 602. Although FIG. 10 shows the imaging element 600 including one gate-controlled storage 612, the imaging element 600 may include a plurality of gate-controlled storages 612 connected, for example, in parallel, in series, or in an array. Although FIG. 10 shows the gate-controlled storage 612 including a planar type MOS structure, the gate-controlled storage 612 may include a trench type MOS structure or a fin type MOS structure.

The imaging element 600 also includes: a global memory 630 including an n type region separated from the photodiode 604 by a predetermined distance, disposed between the overflow path 610 and the first transfer gate electrode 608, and connected to the overflow path 610; a global memory controlling gate electrode 632 adjacent to the global memory 630 in a direction perpendicular to the surface of the substrate or the well 602 and disposed on the surface of the substrate or the well 602; a third transfer gate electrode 634 disposed between the photodiode 604 and the global memory 630 and on the surface of the substrate or the well 602; a floating diffusion region 638 separated from the photodiode 604 by a predetermined distance; and a shutter electrode 636 disposed between the photodiode 604 and the floating diffusion region 638 and on the surface of the substrate or the well 602.

Figure 12:
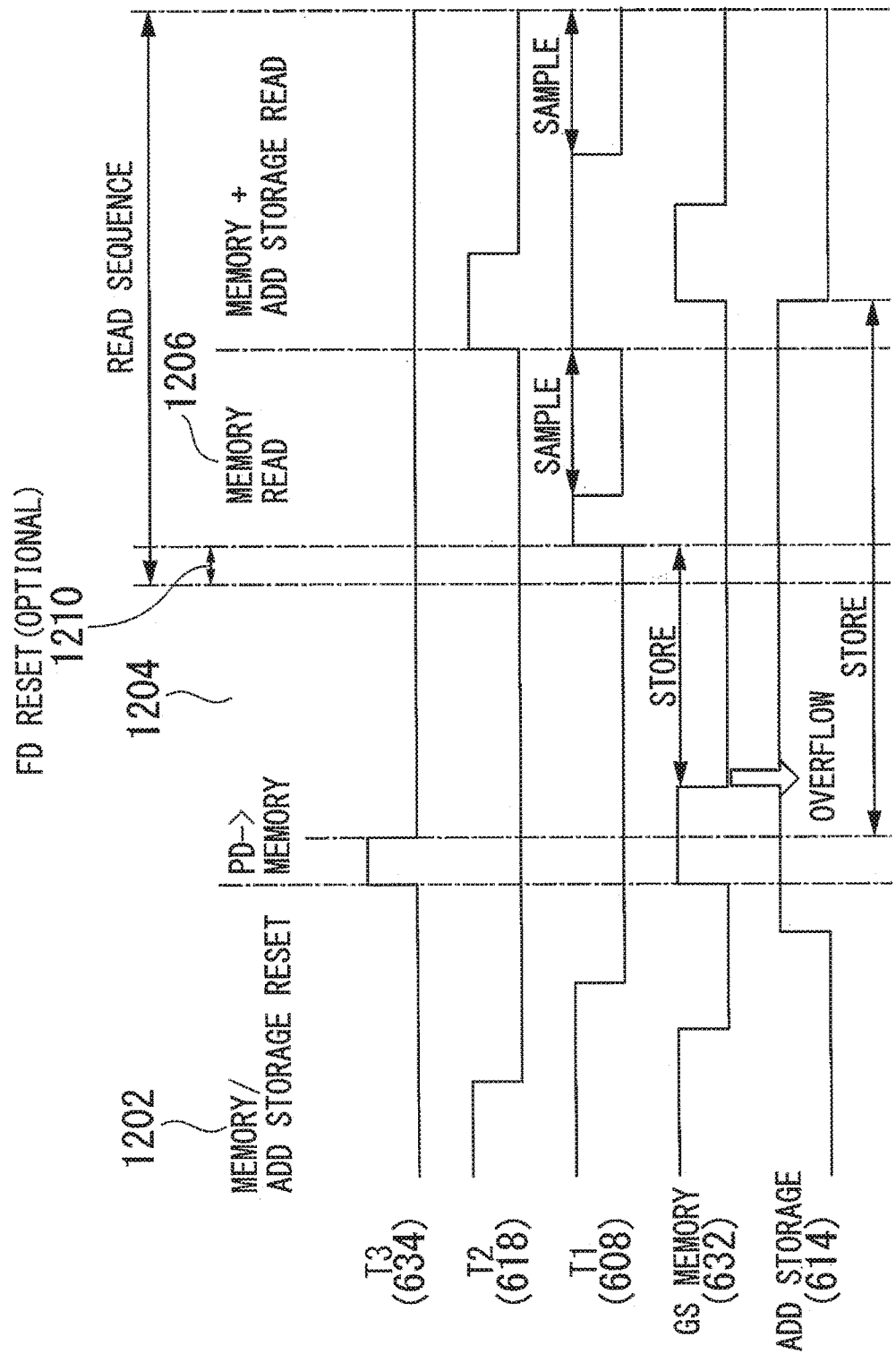
FIG. 12 shows a timing chart representing an operation of the global shutter imaging element shown in FIGS. 10 and 11.

Hereinafter, the operation of the imaging element 600 is described with reference to FIGS. 12 and 13a to 13e. FIG. 12 shows a timing chart 1200 representing the operation of the imaging element 600, and FIGS. 13a to 13e show potentials of a first transfer gate transistor having the first transfer gate electrode 608, a second transfer gate transistor having the second transfer gate electrode 618, the global memory 630, and the gate-controlled storage 612.

Prior to the operations shown in FIG. 12, the shutter electrode 636 is pulled up to deplete and reset the photodiode 604. Then, the shutter electrode 636 is pulled down. Since the third transfer gate electrode 634 is also pulled down, the charge converted from light impinging the photodiode 604 is stored in the photodiode 604. Then, in FIG. 12, operation 1202 of resetting the global memory 630 and the gate-controlled storage 612 is carried out. When the global memory controlling gate electrode 632 is pulled up, the potential of the global memory is lowered in reset operation 1202. Since the storage-controlling gate electrode 614 is pulled down, the potential of the gate-controlled storage 612 is in a high state. When the second transfer gate electrode 618 is pulled up, charges remaining in the gate-controlled storage 612 are transferred to the global memory 630 via the overflow gate 610. The second transfer gate electrode 618 and the global memory controlling electrode 632 are then pulled down, and the first transfer gate electrode 608 is pulled up. In this state, the potential of the global memory 630 becomes higher, and charges remaining in the global memory 630 are transferred to the floating diffusion region 606. Therefore, the global memory 630 and the gate-controlled storage 612 are completely depleted.

Figure 13A:
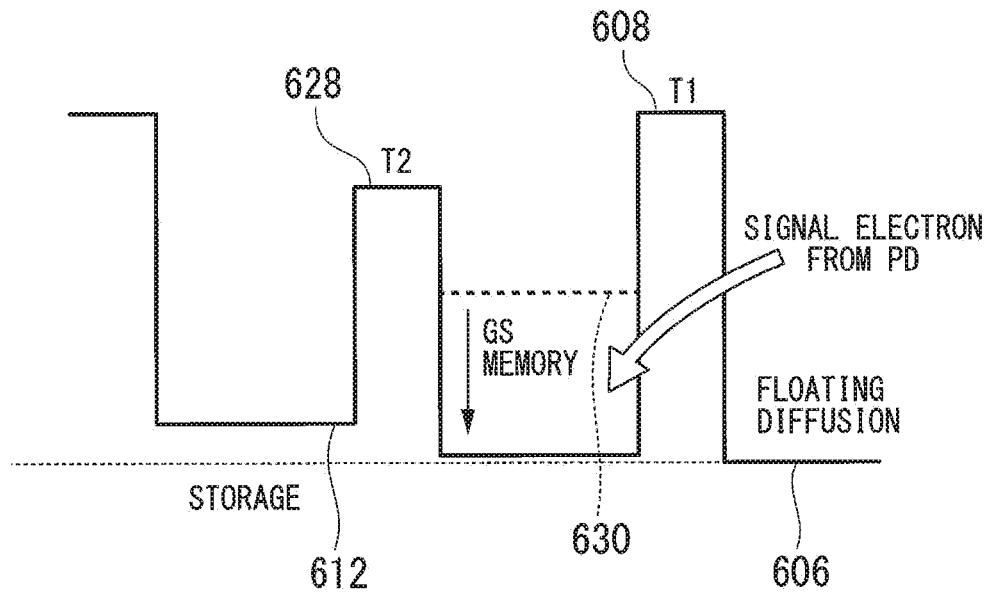
FIG. 13a shows a schematic diagram of a potential of the global shutter imaging element shown in FIGS. 10 and 11 during exposure.
Figure 13B:
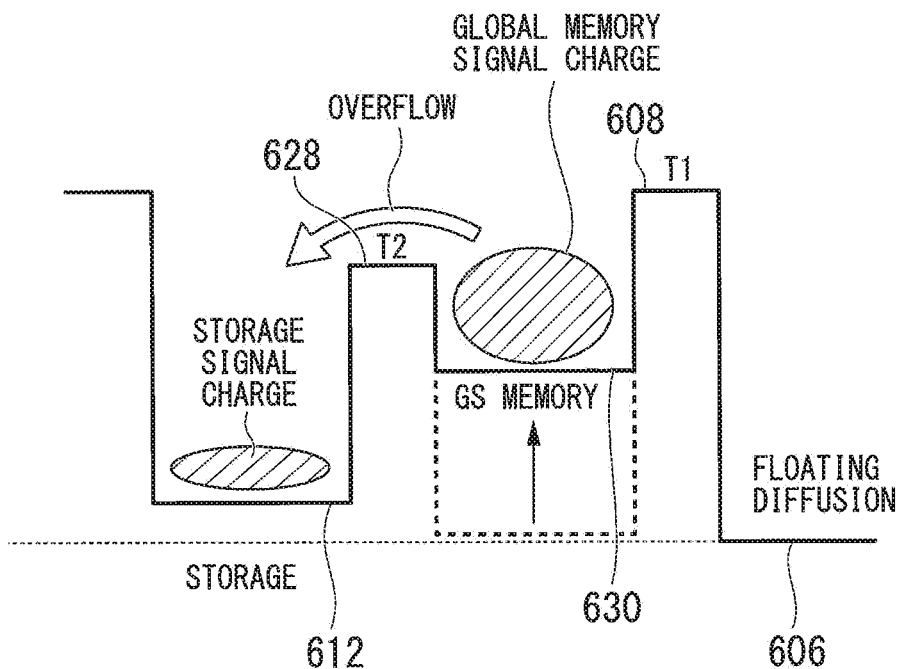
FIG. 13b shows a schematic diagram of a potential of the global shutter imaging element shown in FIGS. 10 and 11 during transferring of a storage signal charge to a gate-controlled storage.
Figure 13C:
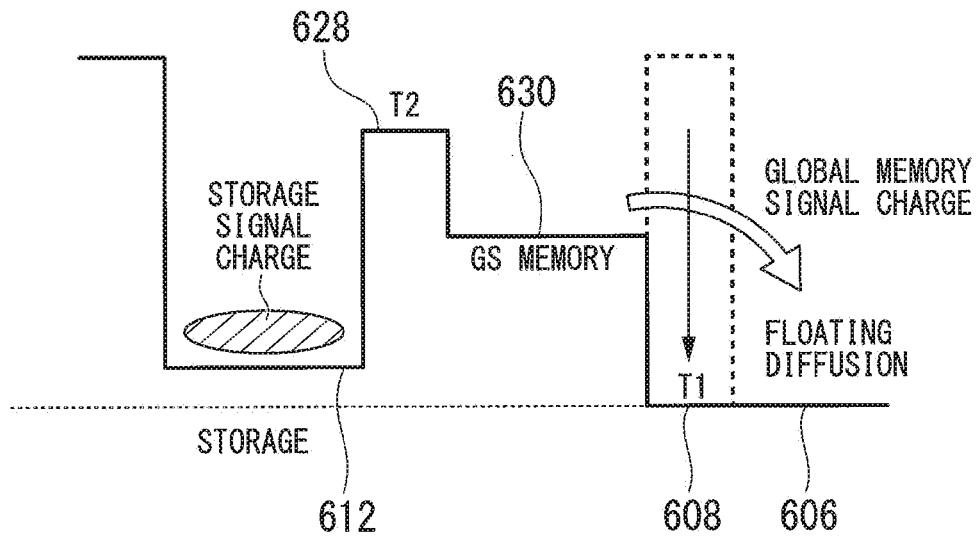
FIG. 13c shows a schematic diagram of a potential of the global shutter imaging element shown in FIGS. 10 and 11 during reading of a global memory signal charge.

The storage operation 1204 is then carried out. As shown in FIG. 13a, the storage-controlling gate electrode 614 and the global memory controlling gate electrode 632 are pulled up, and therefore the potentials of the gate-controlled storage 612 and the global memory 630 are lowered. Then the third transfer gate electrode 634 is pulled up, and the electrons stored in the photodiode 604 by the exposure are transferred to the global memory 630. When the transfer is finished, the third transfer gate electrode 634 is pulled down. As shown in FIG. 13b, the global memory controlling gate electrode 632 is then pulled down, and the potential of the global memory 630 is raised. When the global memory 630 saturates, a part of the electrons is transferred to the gate-controlled storage 612 via the overflow path 610. Then, a operation of resetting the floating diffusion region is carried out. After the floating diffusion region is pulled up and then the transistor for pulling up the floating diffusion region is turned off, the floating diffusion region becomes in a floating state. The voltage of the floating diffusion region in the floating state is read out as a reset signal for CDS discussed below.

The operation 1206 of reading the memory is then carried out. The operation 1206 and the operation 1204 may, in some cases, transition from the operation 1204 based on a reset operation 1210. As to the memory reading operation, also shown in FIG. 13c, the first transfer gate electrode 608 is pulled up, and the potential of the first transfer gate transistor is lowered. The charges stored in the global memory 630 are transferred to the floating diffusion region 606 as a global memory signal charge. Then, the first transfer gate electrode 608 is pulled down and the signal is read out at a detecting node which is not shown in FIG. 12. CDS is then carried out by using this signal and the above reset signal.

Figure 13D:
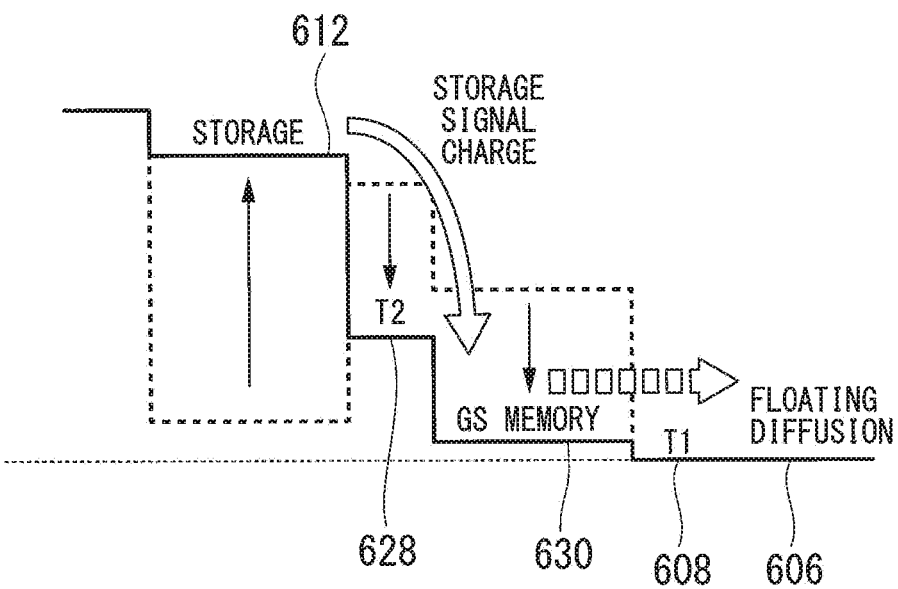
FIG. 13d shows a schematic diagram of a potential of the global shutter imaging element shown in FIGS. 10 and 11 during transferring of the storage signal charge from the gate-controlled storage to a global memory.
Figure 13E:
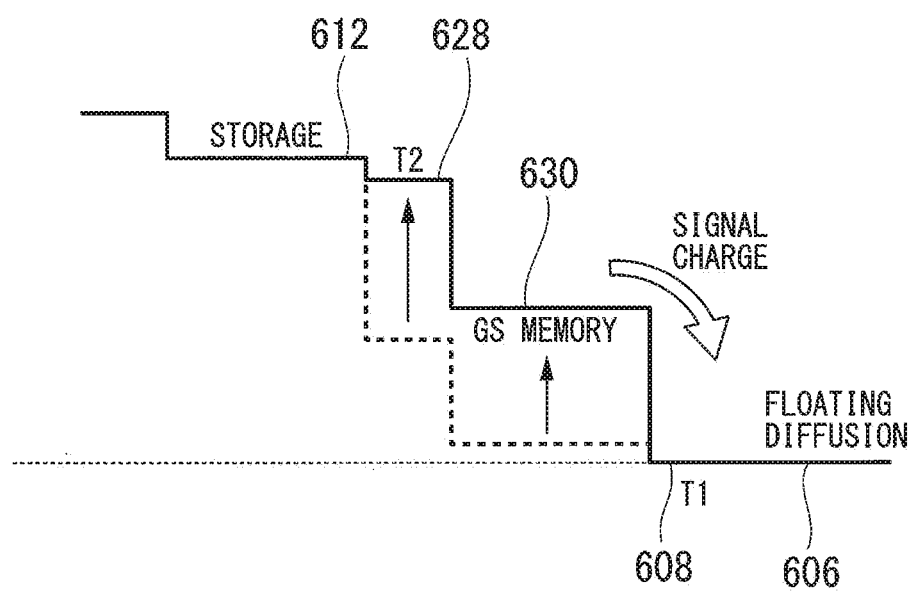
FIG. 13e shows a schematic diagram of a potential of the global shutter imaging element shown in FIGS. 10 and 11 during reading of the global memory signal charge and the storage signal charge.

The operation 1208 of reading the total signal charge is then carried out. The second transfer gate electrode 618 is pulled up. The global memory controlling gate electrode 632 and the second transfer gate electrode 618 are pulled up. The storage-controlling gate electrode 614 is pulled down to raise the potential of the gate-controlled storage 612. Since the potentials of the respective elements are changed as shown in FIG. 13d, the charges stored in the gate-controlled storage 612 are transferred to the floating diffusion region 606 via the global memory 630 as a storage signal charge. The global memory controlling gate electrode 632 is then pulled down, and the first transfer gate electrode 608 is pulled up. The potentials of the respective elements in this state are changed as shown in FIG. 13e. Therefore, all of the storage signal charge and charges remaining in the global memory 630 are transferred to the floating diffusion region 606. After the first transfer gate electrode 608 is pulled down, the signal is read out at the detecting node as the storage signal charge and the residual global memory signal charge. Then, CDS is carried out by using these signals and the above reset signal. After the charge of the photodiode 604 is transferred to the global memory 630, exposure of the photodiode 604 may be carried out during the storage operation 1204 and the read out operations 1206 and 1208.

The imaging element 600 transfers the charges stored in the photodiode 604 due to exposure to the global memory 630 and the gate-controlled storage 612. Therefore, the image sensor configured with the imaging elements 600 can carry out the exposure at all of the imaging elements at the same time by pulling down all of the shutter electrodes 636. Since the charges converted by and stored in the photodiode by the exposure can be transferred to and stored in the global memory and the gate-controlled storage after the exposure, the imaging element 600 can be configured as a global shutter imaging element which is operated in a global shutter scheme in which the exposure is carried out at all of the pixels at the same time and the charges of the imaging elements can be read for each row as disclosed in Patent Publication 2. Since an image sensor employing the global shutter imaging elements as global shutter pixels can carry out the exposure at all of the imaging elements at the same time, the image sensor does not cause image distortions even if an object moving at a fast speed is shot as a still image or recorded as a movie. All of the imaging elements also can carry out the exposure at the same time during reading the charges. Furthermore, a global memory signal charge with a small dark current can be utilized by making the potential of the global memory shallower and reducing charges stored in the global memory. Since charges overflowing from the global memory can be utilized as a storage signal charge stored in the gate-controlled storage, the charges can be stored without saturation even if the amount of light impinging on the imaging element is large. Therefore, an image having a high quality and a large dynamic range can be obtained by using the imaging element 600. This effect becomes more significant by reading the global memory signal charge at a higher gain first, then by reading the total charge of the global memory signal charge and the storage signal charge at a lower gain.

Figure 14:
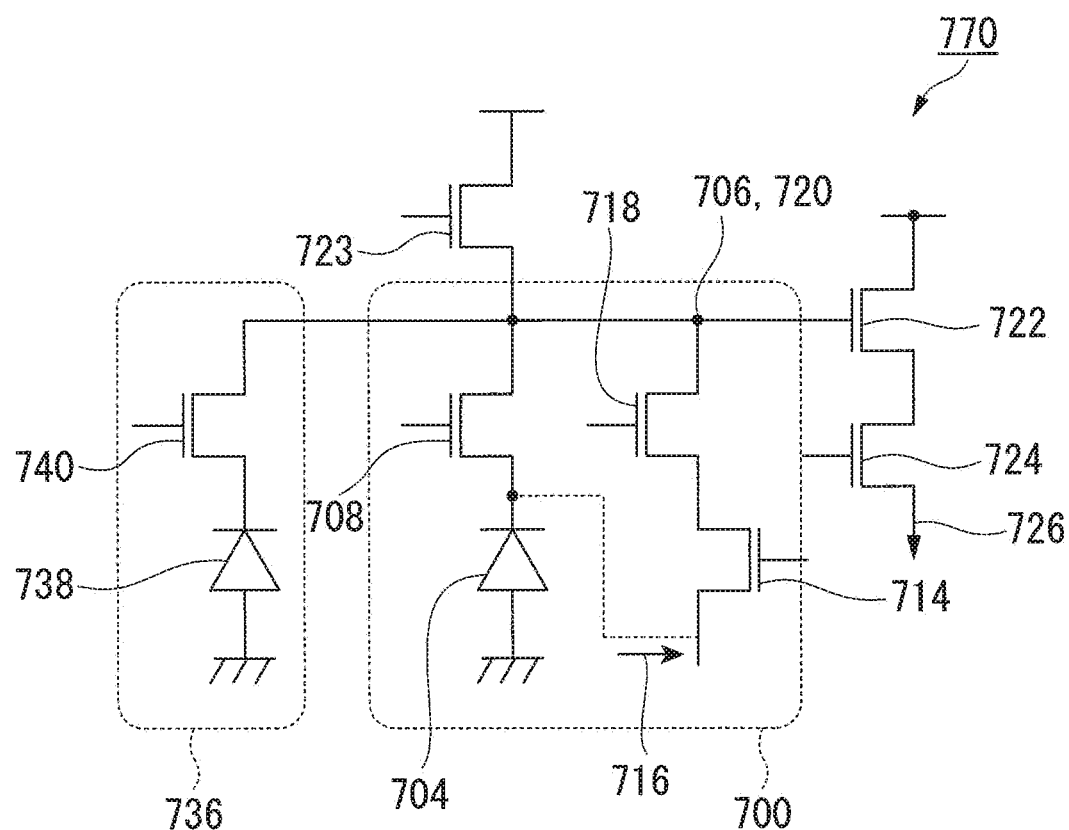
FIG. 14 shows a circuit diagram of an imaging element according to one embodiment of the present disclosure.

FIG. 14 shows a circuit diagram of a pixel 770 according to another embodiment of the present disclosure. The pixel 770 includes a high-sensitivity sub pixel 736 and a low-sensitivity sub pixel 700. An imaging element including a gate-controlled storage according to some embodiments of the present disclosure can be employed as the low-sensitivity sub pixel 700. FIG. 14 shows an example including an imaging element having the same configuration as that of the imaging element 100 as the low-sensitivity sub pixel 700. Therefore, the details of the elements (e.g., the elements 704, 708, 706, 718, and 714) of the low-sensitivity sub pixel 700 (and the associated elements 723, 720, 722, 724, and 726) are similar to examples aforementioned and are not repeated here.

The high-sensitivity sub pixel 736 includes a photodiode 738 and a transfer gate electrode 740. Since the high-sensitivity sub pixel 736 is a conventional pinned photodiode, its dark current is small. Therefore, in a dark, low illuminance condition, it is advantageous to obtain images by using signals output by the high-sensitivity sub pixel. However, since the FWC of the photodiode 738 is smaller than that of the low-sensitivity sub pixel 700 including the gate-controlled storage 712, the photodiode 738 is saturated even with a small amount of light, for example, in a bright, high illuminance condition. In such a condition, it is advantageous to use signals output by the low-sensitivity sub pixel 700. Since the low-sensitivity sub pixel 700 includes an imaging element having the same configuration as the imaging element discussed above, the low-sensitivity sub pixel 700 has a large FWC and is not saturated with a small amount of light, although the low-sensitivity sub pixel 700 has a relatively large noise. Therefore, according to the embodiment, the pixel 770 can synthesize an image having a large dynamic range by using outputs of the sub-pixels which are complementarily effective in low and high illuminance conditions, respectively.

Figure 15:
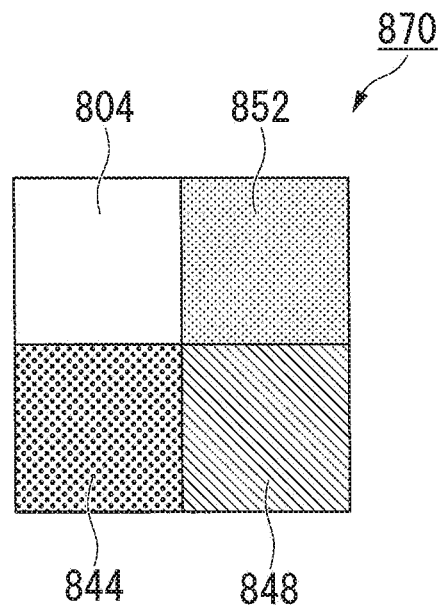
FIG. 15 shows a plan diagram of an imaging element according to one embodiment of the present disclosure.
Figure 16:
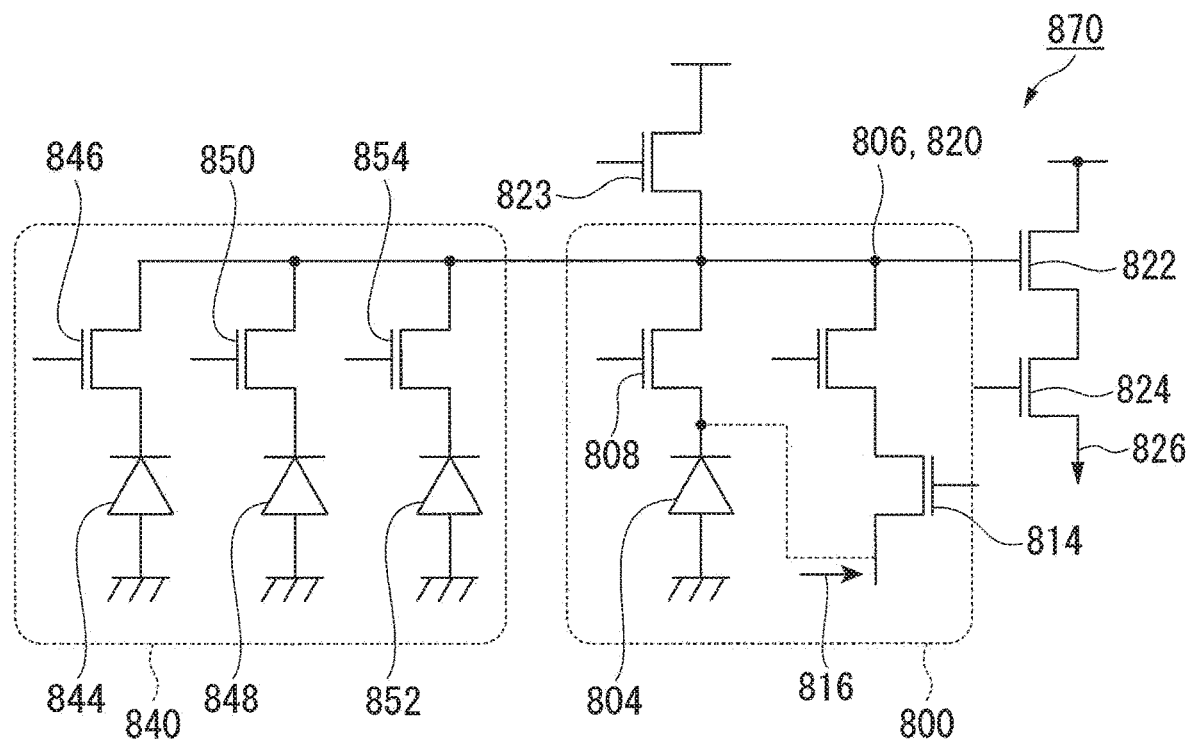
FIG. 16 shows a circuit diagram of the imaging element shown in FIG. 15.
Figure 17:
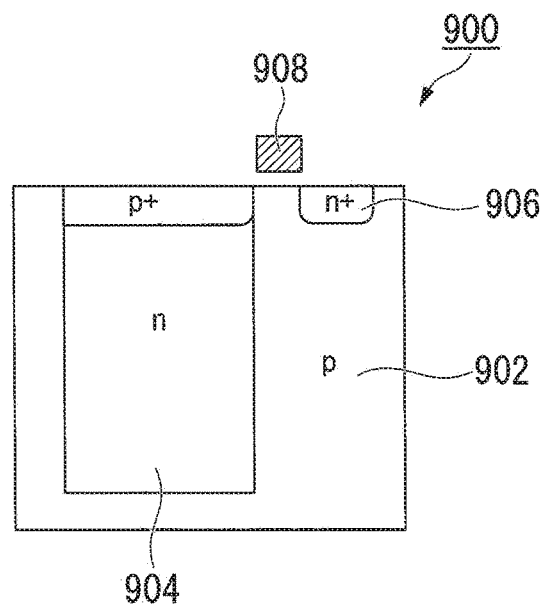
FIG. 17 shows a cross-sectional view of a conventional imaging element having a pinned photodiode structure.
Figure 18:
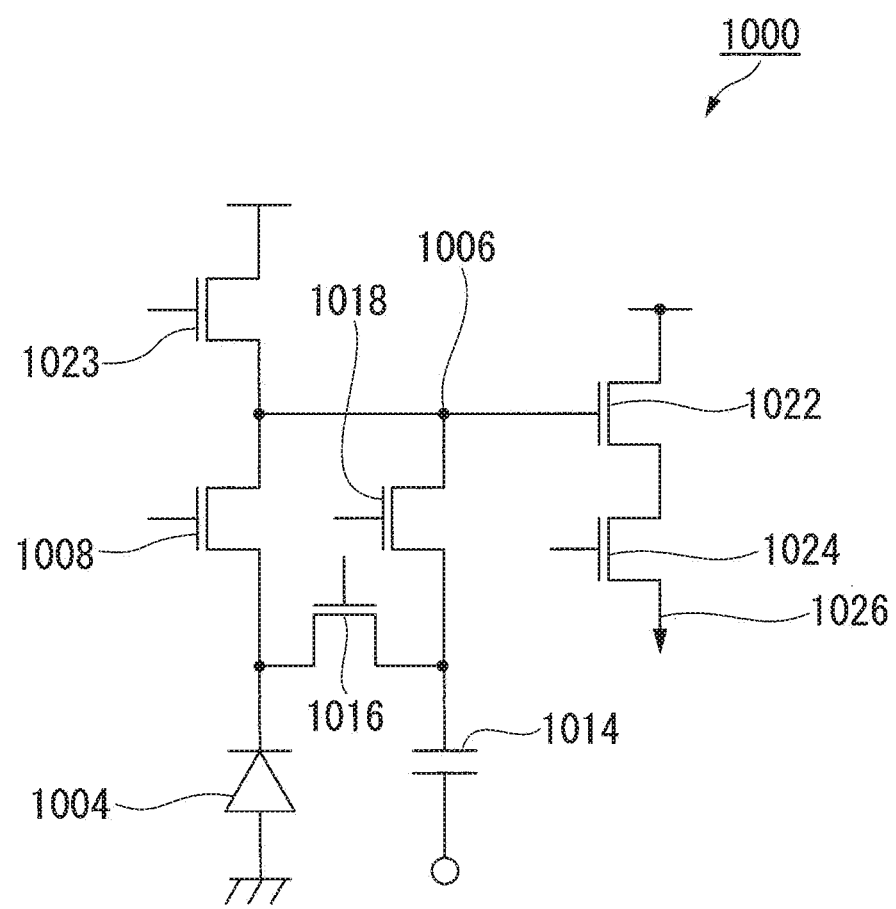
FIG. 18 shows a circuit diagram of a conventional imaging element having an LOFIC structure.

FIG. 15 shows a plan view of a pixel 870 according to another embodiment of the present disclosure, and FIG. 16 is a circuit diagram of the pixel 870. The pixel 870 includes a red-green-blue (RGB) sub pixel 840 including photodiodes 844, 848, 852, having color filters for transmitting red, green, and blue light, respectively. The subpixel 840 further includes transfer gate electrodes 846, 850, and 854 respectively for the photodiodes 844, 848, and 852. The pixel 870 also includes a white sub pixel 800 (including a photodiode 804, a transfer gate electrode 808, and other elements 806, 814, etc.) not having a filter, or a complementary color sub pixel 800 having a complementary color filter, e.g., yellow, cyan, and magenta. The elements (e.g., 823, 822, 824, and 826) of the pixel 870 are similarly configured as examples mentioned above.

The white/complementary color sub pixel has a wavelength bandwidth wider than that of the RGB sub pixel, and therefore generally generates photoelectrons more than the RGB sub pixel even in the same illuminance condition. For example, when imaging is carried out under a white light source, the output of the white/complementary color sub pixel may be three times as the RGB sub pixel. Therefore, the white/complementary color sub pixel has an advantage of a high sensitivity in a low illuminance condition, while the sub pixel is saturated with light having a one-third of intensity of the RGB sub pixel. Therefore, the white/complementary color sub pixel is disadvantageous in the high illuminance condition. However, the white/complementary color sub pixel 800 of the pixel 870 according to the embodiment includes a large FWC due to the same configuration as the imaging element 100. Therefore, the white/complementary color sub pixel 800 of the pixel 870 is not saturated in the same illuminance level as the RGB sub pixel 840 and can provide a large output in a low illuminance level, and therefore improves the dynamic range.

An image sensor including imaging elements according to some embodiments of the present disclosure can be applied to an imaging device such as a camera system. Furthermore, the imaging device such as a camera system can be applied to a device such as a mobile phone and a digital camera.

Although some specific embodiments of the present disclosure were described herein, it should be understood that this description is not intended to limit the scope of the present disclosure. Any modifications, equivalent substitutions, and variations made without deviating from the spirit and principle of the present disclosure should fall within the scope of the present disclosure.

What is claimed is:

1. An imaging element comprising:
   a substrate or a well;
   a pinned photodiode disposed on the substrate or the well;
   a floating diffusion region disposed on the substrate or the well;
   a first transfer gate transistor disposed between the pinned photodiode and the floating diffusion region, the first transfer gate transistor transferring a photodiode signal charge generated by the pinned photodiode to the floating diffusion region;
   a gate-controlled storage disposed on the substrate or the well and storing a signal charge generated by the pinned photodiode as a storage signal charge;
   a storage-controlling gate electrode disposed adjacent to the gate-controlled storage;
   an overflow path disposed between the pinned photodiode and the gate-controlled storage and transferring the storage signal charge from the pinned photodiode to the gate-controlled storage; and
   a detecting node connected to the floating diffusion region, wherein the photodiode signal charge and the storage signal charge can be read at the detecting node,
   wherein the gate-controlled storage is controlled to vary a storable charge capacity by a voltage applied to the storage-controlling gate electrode.

2. The imaging element according to claim 1, wherein the gate-controlled storage is disposed on the same side of the substrate or the well as the side on which the photodiode is disposed.

3. The imaging element according to claim 1, wherein the gate-controlled storage is stacked on the photodiode.

4. The imaging element according to claim 1, further comprising a second transfer gate transistor disposed between the gate-controlled storage and the floating diffusion region,
   wherein the storage signal charge is transferred to the floating diffusion region via the second transfer gate transistor, and is read at the detecting node.

5. The imaging element according to claim 4,
   wherein the second transfer gate transistor comprises at least one of: a planar type transistor, a vertical type transistor, or a fin type transistor.

6. The imaging element according to claim 1, wherein the storage signal charge is transferred to the floating diffusion region via the overflow path, the photodiode, and the first transfer gate transistor, and is read at the detecting node.

7. The imaging element according to claim 1,
   wherein the first transfer gate transistor comprises at least one of: a planar type transistor, a vertical type transistor, or a fin type transistor.

8. The imaging element according to claim 1, wherein the overflow path is a doping region.

9. The imaging element according to claim 1,
   wherein the overflow path has a transistor structure, and
   wherein a conductivity of the overflow path is controlled by a voltage applied to a gate electrode.

10. The imaging element according to claim 1,
    wherein the gate-controlled storage has a planar type MOS structure; or
    wherein the gate-controlled storage has a trench type MOS structure; or
    wherein the gate-controlled storage has a fin type MOS structure.

11. The imaging element according to claim 1, wherein the storage signal charge is summed with the photodiode signal charge and is read at the detecting node.

12. The imaging element according to claim 1, wherein only the photodiode signal charge is read at the detecting node first, and then the storage signal charge is summed with the photodiode signal charge and is read at the detecting node.

13. The imaging element according to claim 12, wherein only the photodiode signal charge is read at a predetermined gain, and then the storage signal charge is summed with the photodiode signal charge and is read at a lower gain.

14. A global shutter imaging element comprising:
    a substrate or a well;
    a pinned photodiode disposed on the substrate or the well;
    a global memory disposed on the substrate or the well;
    a global memory controlling gate electrode disposed adjacent to the global memory;
    a third transfer gate transistor disposed between the pinned photodiode and the global memory, the third transfer gate transistor transferring a photodiode signal charge generated by the pinned photodiode to the global memory;

a gate-controlled storage disposed on the substrate or the well;

an overflow path disposed between the global memory and the gate-controlled storage, the overflow path transferring a signal charge overflowing from the global memory to the gate-controlled storage as a storage signal charge;

a floating diffusion region disposed on the substrate or the well;

a first transfer gate transistor disposed between the global memory and the floating diffusion region, the first transfer gate transistor transferring a signal charge stored in the global memory to the floating diffusion region as a global memory signal charge; and a detecting node connected to the floating diffusion region, wherein the global memory signal charge and the storage signal charge are read at the detecting node, wherein the gate-controlled storage and the global memory are controlled to vary storable charge capacities by voltages applied to a storage-controlling gate electrode and the global memory controlling gate electrode, respectively.

15. The global shutter imaging element according to claim 14, wherein the overflow path has a transistor structure, and wherein a conductivity of the overflow path is controlled by a voltage applied to a gate electrode of the transistor structure.

16. The global shutter imaging element according to claim 14, wherein the overflow path is a doping region.

17. The global shutter imaging element according to claim 14, wherein the storage signal charge stored in the gate-controlled storage is transferred to the detecting node via the overflow path, the global memory, the first transfer gate transistor, and the floating diffusion region.

* * * * *